United States Patent [19]

Lewkowicz et al.

[11] 3,875,809

[45] Apr. 8, 1975

[54] METHOD OF FASTENING A TURRET OSCILLATOR STRIP AND A SCREW RETAINER TO A CHANNEL SELECTOR SHAFT

[75] Inventors: Joseph T. Lewkowicz, Carpentersville; Robert C. Swanson, Woodstock, both of Ill.

[73] Assignee: Oak Industries, Inc., Crystal Lake, Ill.

[22] Filed: Dec. 26, 1973

[21] Appl. No.: 428,428

[52] U.S. Cl. ............... 74/10.15; 74/10.54; 74/10 R; 64/1 R; 403/365; 403/383

[51] Int. Cl. ............... F16h 35/18

[58] Field of Search ............ 74/10.54, 10.85, 10.80, 74/10, 10.2, 10.39, 10.52; 403/365, 383; 64/1 R, 1 C, 3, 6

[56] References Cited

UNITED STATES PATENTS

| | | | |
|---|---|---|---|
| 2,934,964 | 5/1960 | Parsons | 74/10.15 |
| 2,983,885 | 5/1961 | Thompson | 74/10.6 |
| 3,254,539 | 6/1966 | Ma | 74/10 R |
| 3,572,134 | 3/1971 | Kemeny | 74/10.85 |
| 3,774,459 | 11/1973 | Valdetlers | 74/10.54 |

*Primary Examiner*—Samuel Scott
*Assistant Examiner*—Randall Heald
*Attorney, Agent, or Firm*—Kinzer, Plyer, Dorn & McEachran

[57] ABSTRACT

A television tuner includes a housing and a channel selector shaft rotatably journaled in the housing. An oscillator coil retainer and an oscillator screw retainer are mounted on a flatted portion of the shaft and interlocked to the shaft to prevent both relative movement between the retainers and between the shaft. The coil retainer includes a hub extending axially along the shaft with at least a portion of the screw retainer being mounted on the hub and having flexible projections extending into an adjacent groove on the channel selector shaft.

11 Claims, 5 Drawing Figures

PATENTED APR 8 1975 3,875,809

METHOD OF FASTENING A TURRET OSCILLATOR STRIP AND A SCREW RETAINER TO A CHANNEL SELECTOR SHAFT

SUMMARY OF THE INVENTION

This invention relates to a television tuner and in particular to means for mounting an oscillator coil retainer and an oscillator screw retainer to the tuner channel selector shaft.

A primary purpose of the invention is a television tuner construction of the type described which tightly locks the coil retainer and screw retainer to the channel selector shaft.

Another purpose is a construction of the type described preventing relative angular movement between the coil retainer and the screw retainer.

Another purpose is a channel selector shaft construction of the type described preventing relative axial movement between the shaft, oscillator coil retainer and oscillator screw retainer.

Other purposes will appear in the ensuing specification, drawings and claims.

BRIEF DESCRIPTION OF THE DRAWINGS

The invention is illustrated diagrammatically in the following drawings wherein.

DESCRIPTION OF THE PREFERRED EMBODIMENT

Figure 1:
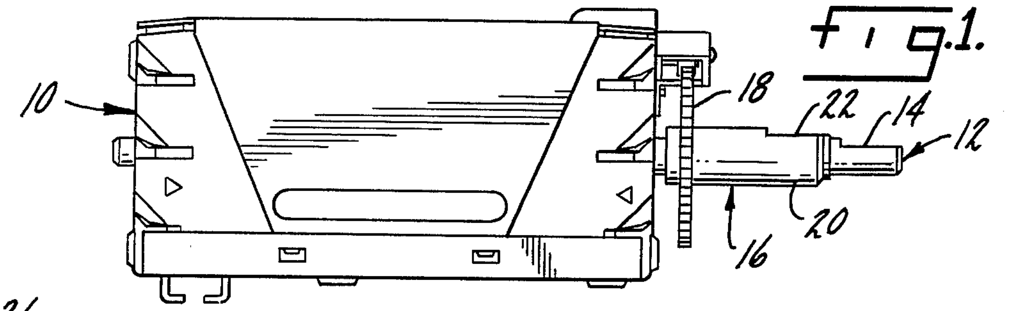
FIG. 1 is a side view of a tuner of the type described.

In the drawings, the tuner housing is indicated at 10 and the channel selector shaft is indicated generally at 12. The selector shaft 12 may have a flatted area 14 for use in attaching the channel selector knob. A fine tuning assembly 16 includes a gear 18 used for rotating the oscillator screws for individual channel adjustment. The assembly 16 may further include a sleeve 20 and a flatted area 22 for use in mounting the fine tuning control.

Figures 2, 3:
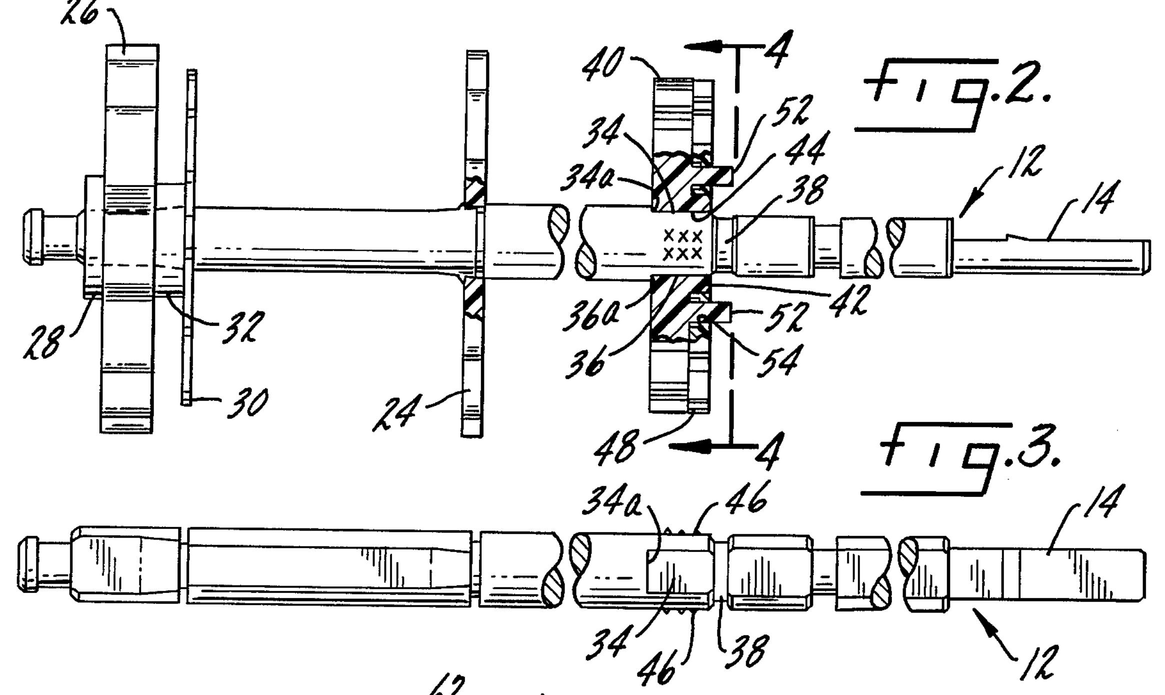
FIG. 2 is an enlarged partial side view of the channel selector shaft and the elements mounted thereon.
FIG. 3 is a top view of the channel selector shaft.

The present tuner may be of the type which utilizes individual coil strips for the various channel oscillators. Clearly, the mounting arrangement described herein is equally satisfactory with other types of oscillator coil support members. As shown in FIG. 2, the shaft 12 may mount a shield 24, generally intermediate its ends, which shield is suitably fastened to the shaft. A detent wheel 26 is mounted at the far left end of the shaft 12 and is held in position by a collar 28. Immediately adjacent the detent wheel 26 is an oscillator strip spring member 30 which is suitably fastened to the shaft 12 and spaced from the detent wheel 26 by a washer 32.

To the right of the oscillator shield 24 there are a pair of flatted surfaces 34 and 36 formed on the shaft 12. The flatted surfaces are parallel and each define shoulders 34a and 36a. Adjacent the flatted areas 34 and 36 the shaft 12 has a circumferentially extending groove 38.

An oscillator strip retainer is indicated at 40 and has an axially extending hub 42. The strip retainer 40 is positioned on that section of the shaft 12 having the flatted areas 34 and 36. Thus, the shaft cross section at this point is in the shape of a double D with the bore 44 and the strip retainer having a like cross section. In order to interlock and hold the strip retainer 40 to the shaft 12 there may be staking projections 46 in the area of the flats 34 and 36, but generally on the round portions of the shaft. Thus, as the strip retainer 40 is axially moved onto the shaft, and assuming it is made of a deformable material, such as a suitable plastic, it will be rigidly held by the double D cross section and by the staking areas 46.

An oscillator screw retainer is indicated at 48 and has an inner surface 50 seated upon the oscillator coil retainer hub 42. The coil retainer 40 may have a pair of axially extending pins 52 which are positioned in mating holes 54 of the screw retainer. Thus, the two members are prevented from relative angular movement. Preferably the pins 52 and the mating holes 54 are not regularly or uniformly spaced to the effect that there is only one way in which the two members may be axially telescopically assembled together.

The screw retainer 48 may have a pair of inwardly -extending projections or ears 56 which are flexible and which extend into the groove 38 on the channel selector shaft. Preferably the screw retainer is formed of a plastic material having a sufficient degree of flexibility to appropriately hold the oscillator screws in an adjusted position.

Figures 4, 5:
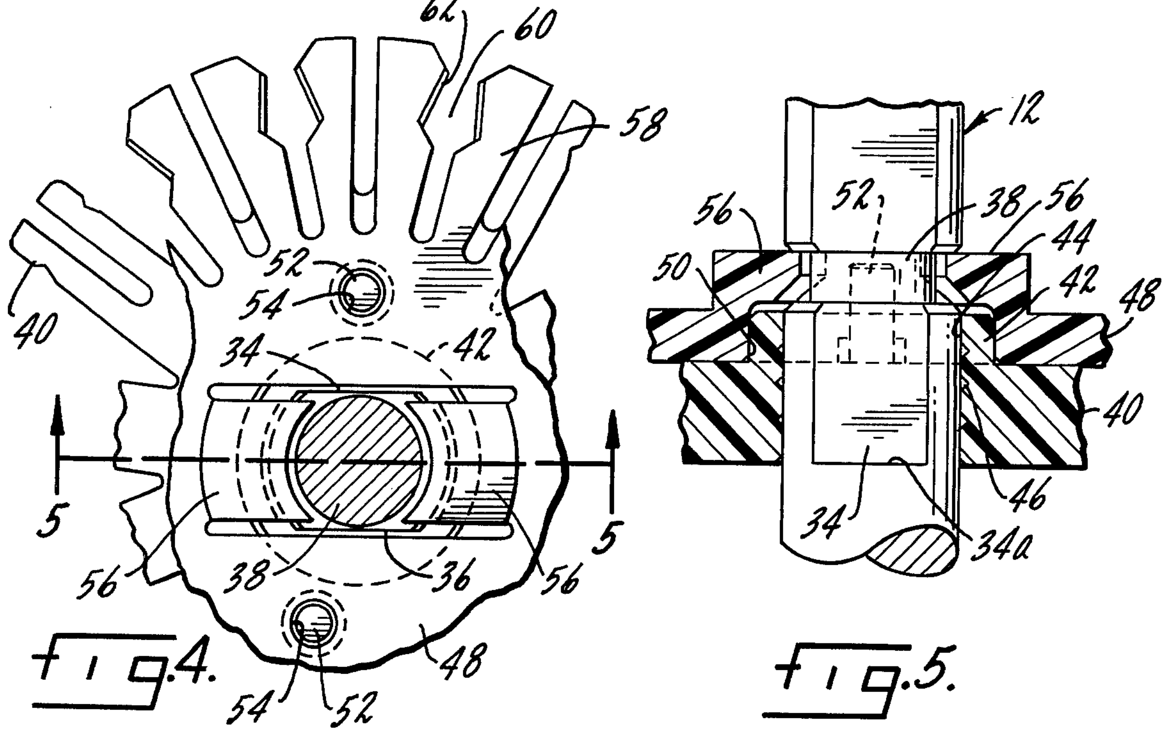
FIG. 4 is a partial section along plane 4—4 of FIG. 2.
FIG. 5 is a partial section plane 5—5 of FIG. 4.

The details of the oscillator coil retainer and the screw retainer, as far as these elements function to hold the oscillator coils and the oscillator screws do not themselves form a part of the present invention. However, as shown in FIG. 4, the screw retainer may have radially extending arms 58 which define gaps 60, with the oscillator screws being held by lips 62 integral with the arms and along the edge of each gap.

Of particular importance in the invention is the interlock between the oscillator coil retainer and the screw retainer. A pair of axially extending pins are positioned in mating holes in such a manner that these two elements can only be assembled in the appropriate manner on the shaft. Thus, there can be no angular movement between these two elements. The coil retainer has an axially extending hub, with the screw retainer being telescopically mounted on the hub. Since the hub is relatively long, excellent stability is obtained between the retainers and the channel selector shaft. The oscillator screw retainer incorporates a pair of flexible arms or ears or projections which are positioned within or seat in a groove in the channel selector shaft, thus tightly locking the entire assembly onto the channel selector shaft. The hub of the coil retainer is positioned on a double D portion of the channel selector shaft and abuts a pair of shoulders formed by the flats on the shaft. Projections formed by a staking operation are used to hold the coil retainer to the shaft.

Whereas the preferred form of the invention has been shown and described herein, it should be realized that there may be many modifications, substitutions and alterations thereto.

The embodiments of the invention in which an exclusive privilege or property is claimed are defined as follows:

1. In a TV tuner, a housing, a channel selector shaft rotatably mounted in said housing, a flatted area on said shaft, an oscillator coil mounting member positioned on said flatted area, said member having an axially extending hub, and an oscillator screw retainer mounted on said shaft and at least partly telescopically mounted on said hub, an interlock between the oscillator coil mounting member and the oscillator screw retainer preventing relative angular movement therebetween.

2. The structure of claim 1 further characterized in that said flatted area defines a shoulder on said shaft, said oscillator coil mounting member being positioned against said shoulder.

3. The structure of claim 2 further characterized by and including a pair of flatted areas, parallel with each other, and coextensively arranged on the shaft, with each flatted area defining a shoulder, said oscillator coil mounting member abutting said shoulders.

4. The structure of claim 1 further characterized in that said hub extends axially along and in contact with said shaft.

5. The structure of claim 1 further characterized in that said shaft includes a groove adjacent the flatted area, said oscillator screw retainer having at least one inwardly-directed flexible portion positioned within said groove.

6. The structure of claim 5 further characterized by a pair of generally oppositely positioned projections integral with said oscillator screw retainer and positioned within said groove.

7. The structure of claim 1 further characterized in that said interlock includes at least one pin extending outwardly from one of said members and a mating hole on the other of said members.

8. The structure of claim 1 further characterized in that said interlock includes a pair of axially extending pins on said member and a pair of mating holes on said oscillator screw retainer.

9. The structure of claim 8 further characterized in that said pins and holes are non-uniformly positioned.

10. In a TV tuner, a housing, a channel selector shaft rotatably mounted in said housing, an oscillator coil mounting member positioned on said shaft, an oscillator screw retainer mounted on said shaft adjacent said mounting member and in contact therewith, a groove in said shaft, said oscillator screw retainer having at least one flexible projection extending into said groove to lock the oscillator screw retainer to the shaft.

11. In a TV tuner, a housing, a channel selector shaft rotatably mounted in said housing, an oscillator coil mounting member positioned on said shaft, an oscillator screw retainer mounted on said shaft adjacent to and in contact with said mounting member, and an interlock between said mounting member and screw retainer preventing relative angular movement therebetween, said interlock including an axially extending pin on either of said mounting member or screw retainer and a mating hole on the other.

* * * * *